United States Patent
Choy et al.

(10) Patent No.: US 11,404,657 B2
(45) Date of Patent: Aug. 2, 2022

(54) METHOD OF FABRICATING PEROVSKITE PERIODIC NANOSTRUCTURE INCLUDING SOLID-LIQUID-SOLID PHASE TRANSFORMATION

(71) Applicant: THE UNIVERSITY OF HONG KONG, Hong Kong (CN)

(72) Inventors: Chik Ho Wallace Choy, Hong Kong (CN); Jian Mao, Hong Kong (CN)

(73) Assignee: THE UNIVERSITY OF HONG KONG, Hong Kong (CN)

( * ) Notice: Subject to any disclaimer, the term of this patent is extended or adjusted under 35 U.S.C. 154(b) by 792 days.

(21) Appl. No.: 16/319,171

(22) PCT Filed: Jul. 28, 2016

(86) PCT No.: PCT/CN2016/091992
§ 371 (c)(1),
(2) Date: Jan. 18, 2019

(87) PCT Pub. No.: WO2018/018481
PCT Pub. Date: Feb. 1, 2018

(65) Prior Publication Data
US 2021/0376276 A1    Dec. 2, 2021

(51) Int. Cl.
*H01L 51/50*  (2006.01)
*H01L 51/00*  (2006.01)
*H01L 51/56*  (2006.01)

(52) U.S. Cl.
CPC ........ *H01L 51/5032* (2013.01); *H01L 51/003* (2013.01); *H01L 51/0007* (2013.01);
(Continued)

(58) Field of Classification Search
CPC ............. H01L 51/5032; H01L 51/0007; H01L 51/0028; H01L 51/003; H01L 51/0077;
(Continued)

(56) References Cited

U.S. PATENT DOCUMENTS

| 5,246,898 A | 9/1993 | Fujimaru et al. |
| 2016/0254472 A1* | 9/2016 | Wang .................. C23C 14/5846 136/263 |

FOREIGN PATENT DOCUMENTS

| CN | 102241967 A | 11/2011 |
| CN | 104882543 A * | 9/2015 |

(Continued)

OTHER PUBLICATIONS

D. Bi, et al., "Efficient luminescent solar cells based on tailored mixed-cation perovskites," Sci Adv, Jan. 1, 2016, 2, pp. 1-7.
(Continued)

*Primary Examiner* — Ermias T Woldegeorgis
(74) *Attorney, Agent, or Firm* — Leason Ellis LLP

(57) ABSTRACT

A solid-liquid-solid phase transformation (SLSPT) approach is used for fabrication of perovskite periodic nanostructures. The pattern on a mold is replicated by perovskite through phase change of perovskite from initially solid state, then to liquid state, and finally to solid state. The LED comprising perovskite periodic nanostructure shows better performance than that with flat perovskite. Further, the perovskite periodic nanostructure from SLSPT can be applied in many optoelectronic devices, such as solar cells, light emitting diodes (LED), laser diodes, transistors, and photodetectors.

15 Claims, 10 Drawing Sheets

(52) U.S. Cl.
CPC ...... *H01L 51/0028* (2013.01); *H01L 51/0097* (2013.01); *H01L 51/56* (2013.01); *H01L 51/0035* (2013.01); *H01L 51/0037* (2013.01); *H01L 51/0077* (2013.01); *H01L 2251/105* (2013.01); *H01L 2251/5338* (2013.01); *H01L 2251/556* (2013.01)

(58) Field of Classification Search
CPC . H01L 51/0097; H01L 51/4246; H01L 51/56; H01L 51/0035; H01L 51/0037; H01L 2251/105; H01L 2251/5338; H01L 2251/556; H01L 51/5012; H01L 51/0049; H01L 51/005; Y02E 10/549; C30B 29/12; C30B 29/60
See application file for complete search history.

(56) References Cited

FOREIGN PATENT DOCUMENTS

| CN | 104934304 A | * | 9/2015 |
|---|---|---|---|
| CN | 105350078 A | | 2/2016 |
| CN | 105552236 A | | 5/2016 |
| EP | 1419814 A1 | | 5/2004 |
| WO | WO 2015/139082 A1 | | 9/2015 |

OTHER PUBLICATIONS

H. Cho, et al, "Overcoming the electroluminescence efficiency limitations of perovskite light-emitting diodes." Science, Dec. 4, 2015, vol. 350, pp. 1222-1225.
H. Zhu, et al., Lead halide perovskite nanowire lasers with low lasing thresholds and high quality factors, Nature Materials, Jun. 2015, vol. 14, pp. 636-642.
X. Y. Chin, et al, "Lead iodide perovskite light-emitting field-effect transistor," Nature Communications, Jun. 25, 2015, 6:7383, 9 pages.
L. Dou, et al., "Solution-processed hybrid perovskite photodetectors with high detectivity," Nature Communications, Sep. 29, 2014, 5:5404, 7 pages.
Y. Ogomi, et al., $CH_3NH_3Sn_xPb_{(1-x)}I_3$ Perovskite Solar Cells Covering up to 1060 nm, J Phys Chem Lett, 2014, 5, pp. 1004-1011.
A. Sadhanala, et al., "Blue-Green Color Tunable Solution Processable Organolead Chloride-Bromide Mixed Halide Perovskites for Optoelectronic," Nano Lett, 2015, 15, 6095-6101.
H. S. Kim, et al., "Lead Iodide Perovskite Sensitized All-Solid-State Submicron Thin Film Mesoscopic Solar Cell with Efficiency Exceeding 9%," Scientific Reports, 2012, 2, 591, 7 pages.
J. W. Lee, et al., "High-Efficiency Perovskite Solar Cells Based on the Black Polymorph of $HC(NH_2)_2PbI_3$," Advanced Materials, 2014, 26, pp. 4991-4998.
Z. K. Tan, et al., "Bright light-emitting diodes based on organometal halide perovskite," Nature Nanotechnology, Sep. 2014, vol. 9, pp. 687-692.
J. Wang, et al., "Interfacial Control Toward Efficient and Low-Voltage Perovskite Light-Emitting Diodes," Advanced Materials, 2015, 27, pp. 2311-2316.
X. Li, et al., "Dual Plasmonic Nanostructures for High Performance Inverted Organic Solar Cells X," Advanced Materials, 2012, 24, pp. 3046-3052.
C.-M. Hsu, et al. "High-Efficiency Amorphous Silicon Solar Cell on a Periodic Nanocone Back Reflector," Advanced Energy Materials, 2012, 2, pp. 628-633.
B. J. Matterson, et al., "Increased Efficiency and Controlled Light Output from a Microstructured Light-Emitting Diode," Advanced Materials, Jan. 2001, 13, pp. 123-127.

H. Kogelnik, et al., "Coupled-Wave Theory of Distributed Feedback Lasers," Journal of Applied Physics, 1972, 43, pp. 2327-2335.
H. G. Park, et al., "Coupled-Wave Theory of Distributed Feedback Lasers," Science, 2004, 305, pp. 1444-1447.
T. Leijtens, et al., Stability of Metal Halide Perovskite Solar Cells, Advanced Energy Materials, 2015, 5, 1500963. 23 pages.
M S.Alias, et al., "Focused-ion beam patterning of organolead trihalide perovskite for subwavelength grating nanophotonic applications," Sci Technol B, 2015, 33, 051207, 10 pages.
M. S. Alias, et al. "Enhanced Etching, Surface Damage Recovery, and Submicron Patterning of Hybrid Perovskites using a Chemically Gas-Assisted Focused-Ion Beam for Subwavelength Grating Photonic Applications," J Phys Chem Lett, 2016, 7, pp. 137-142.
N. J. Jeon, et al. "Solvent engineering for high-performance inorganic-organic hybrid perovskite solar cells," Nature Materials, Sep. 2014, 13, pp. 897-903.
X.L. Zhu, et al., "A studyofopticalpropertiesenhancementinlowbandgappolymer solar cells with embedded PEDOT: PSSgratings,", Solar Energy Materials and Solar Cells, 2012, 99, pp. 327-332.
J. Mao, et al., "Smooth CH3NH3PbI3 from controlled solid-gas reaction for photovoltaic applications," RSC Advances., 2015, 5, 7 pp. 3760-73766.
Z. Zhou, et al., "Methylamine-Gas-Induced Defect-Healing Behavior of CH3NH3PbI3 Thin Films for Perovskite Solar Cells," Angew Chem Int Ed Engl, 2015, 54, pp. 9705-9709.
J. M. Ziebarth, et al., "Extracting Light from Polymer Light-Emitting Dioedes Using Stamped Bragg Gratings," Advanced Functional Materials, 2004, 14, pp. 451-456.
G. E. Eperon, et al., "Cation exchange for thin film lead iodide perovskite interconversion," Materials Horizons, 2016, 3, pp. 63-71.
M. Saliba, et al, "Structured Organic-Inorganic Perovskite toward a Distributed Feedback Laser," Advanced Materials, 2016, 28, pp. 923-929.
S. Chen, et al, "A Photonic Crystal Laser from Solution Based Organo-Lead Iodide Perovskite Thin Films," ACS Nano, 2016, 10, pp. 3959-3967.
W. S. Yang, et al., "High-performance photovoltaic perovskite layers fabricated through intramolecular exchange," Science Jun. 12, 2015, vol. 348, Issue 6240, pp. 1234-1237.
Y. Zhao, et al., "Anomalously large interface charge in polarityswitchable photovoltaic devices: an indication of mobile ions in organic-inorganic halide perovskites," Energy Environ. Sci. 2015, 8, pp. 1256-1260.
J. Burschka, et al., "Sequential deposition as a route to high-performance perovskite-sensitized solar cells," Nature, 2013, 499, pp. 316-319.
P. Gao, et al., "Organohalide lead perovskites for photovoltaic applications," Energy Environ. Sci. 2014 7, pp. 2448-2463.
Y. Wu, A., et al, "Retarding the crystallization of $PbI_2$ for highly reproducible planar-structured perovskite solar cells via sequential deposition Islam," Energy Environ. Sci. 2014, 7, pp. 2934-2938.
H.-S. Kim, et al., "J. Parameters Affecting I-V Hysteresis of $CH_3NH_3PbI_3$ Perovskite Solar Cells: Effects of Perovskite Crystal Size and Mesoporous $TiO_2$ Layer," Chemistry Letters 2014, 5, pp. 2927-2934.
Y. Shao, et al., "Origin and elimination of photocurrent hysteresis by fullerene passivation in CH3NH3PbI3 planar heterojunction solar cells," Nature Communications, 2014, 5, 5784, 8 pages.
N. Ahn, et al., "Highly Reproducible Perovskite Solar Cells with Average Efficiency of 18.3% and Best Efficiency of 19.7% Fabricated via Lewis Base Adduct of Lead(II) Iodide," J. Am. Chem. Soc. 2015, 137, pp. 8696-8699.
International Search Report and Written Opinion in corresponding PCT Application No. PCT/CN2016/091992, dated May 8, 2017.

* cited by examiner

METHOD OF FABRICATING PEROVSKITE PERIODIC NANOSTRUCTURE INCLUDING SOLID-LIQUID-SOLID PHASE TRANSFORMATION

CROSS-REFERENCE TO RELATED PATENT APPLICATIONS

This application is a U.S. National Phase application under 35 U.S.C. § 371 of International Patent Application No PCT/CN2016/091992, filed Jul. 28, 2016, which is incorporated by reference in its entirety. The International Application was published on Feb. 1, 2018 as International Publication No. WO/2018/018481 A1.

FIELD OF THE INVENTION

This invention relates to fabrication of perovskite periodic nanostructures and its application in optoelectronic devices.

BACKGROUND OF THE INVENTION

Organic-inorganic hybrid perovskite has attracted global attention in recent years for its extensive applications in optoelectronic devices. The demonstrated applications of three-dimensional organometallic halide perovskite thin film include solar cells, light emitting diodes (LEDs), lasers, transistors, and photodetectors. Such wide application of perovskite is intimately related to its unique chemical structure. The general formula of three-dimensional perovskite is $ABX_3$ ($A=CH_3NH_3$, $HC(NH_2)_2$, or Cs, B=Pb or Sn, X=Cl, Br, or I). The band gap (Eg) of perovskite can be easily tuned from 1.17 eV to 3.0 eV by simply varying the constituent of A, B, and X.

Most of the uses of perovskite are based on a flat thin film of perovskite, which can be formed through a variety of methods, such as spin coating, thermal evaporation, and doctor blading. On the other hand, compared with flat thin film, the periodic nanostructure of semiconductors has incomparable optical properties. In the photovoltaic area, semiconductor periodic nanostructure associated with metal electrodes has been utilized to stimulate Surface Plasmon and also to increase the light path length within semiconductors in order to improve the power conversion efficiency (PCE) of corresponding solar cells. In addition, periodic nanostructure has been applied in LEDs to increase light extraction. Furthermore, distributed feedback (DFB) lasers and photonic crystal lasers can be realized after precisely designing semiconductor periodic nanostructure.

However, the challenge for directly patterning perovskite lies in its chemical instability. It is reported that perovskite will decompose after exposure to polar solvents, such as water, methanol, and acetone. The photolithography usually used for nanofabrication can damage perovskite since the developer of the photoresist used in that process is normally dissolved in water. On the other hand, the high-power ions from a focused-ion beam used in photolithography will not only remove the perovskite that is unwanted, but it will also decompose the nearby perovskite. In that case, the perovskite pattern obtained with photolithography may be quite different from the intended design. Besides, the crystal quality of perovskite can be damaged. It has been reported that the process of though gas-assisted focused-ion beam etching relieves the damage of perovskite during fabrication. However, the reduced photoluminescence (PL) of patterned perovskite compared with pristine flat perovskite indicates that the film quality of patterned perovskite is still worsened.

SUMMARY OF THE INVENTION

The present invention is directed to a novel solid-liquid-solid phase transformation (SLSPT) approach for the fabrication of perovskite periodic nanostructure with high crystal quality. In an exemplary embodiment, the approach includes forming flat perovskite thin film on a substrate, covering the perovskite thin film with a periodic mold, then converting the solid perovskite thin film into a liquid intermediate by reacting it with a chemical, subsequently recovering liquid intermediates into solid perovskite by removing the introduced chemical, and lifting up the mold. The result is the fabrication of a perovskite periodic nanostructure.

The high-quality perovskite periodic nanostructures are prepared through the phase transformation in which perovskite grows by itself into the periodic nanostructure. The approach used with the present invention does not need a traditional and costly lithography nanofabrication technique which directly patterns the semiconductor and then etches it away. The latter heavily relies on skill, expensive equipment and use of a lot of chemicals in patterning.

The initial flat $MAPbI_3$ thin film can be prepared on a PEDOT:PSS/ITO substrate according to the solvent engineering approach.

The present approach can provide several advantages. According to one aspect of the invention, the whole process avoids polar solvents (such as water), or high temperatures (>150° C.), or high-power particles hitting and damaging the perovskite. According to another aspect of the invention, the initial flat perovskite thin film can be prepared by different approaches. It is not limited to a single certain approach. According to yet another aspect of the invention, the liquid intermediate forms a close contact with the periodic mold and thus contributes to accurate replication of the pattern from the mold. According to a further aspect of the invention, the visible grain boundary in a pristine thin film disappears after forming the periodic nanostructure, which indicates that the perovskite periodic nanostructure may have the properties of a single crystal. Further benefits include, but are not limited to, the crystal quality of the perovskite periodic nanostructure being improved in contrast with its flat thin film version. More importantly, a LED made with a perovskite periodic nanostructure is superior to that with a flat perovskite thin film. Last but not least, the perovskite periodic nanostructure created using the SLSPT approach is suitable for different optoelectronic devices, such as solar cells, LEDs, laser diodes, photodetectors, and transistors. More benefits will be understood and appreciated from embodiments as detailed below.

BRIEF DESCRIPTION OF THE DRAWINGS

The foregoing and other objects and advantages of the present invention will become more apparent when considered in connection with the following detailed description and appended drawings in which like designations denote like elements in the various views, and wherein.

DETAILED DESCRIPTION OF THE INVENTION

Figure 1A:
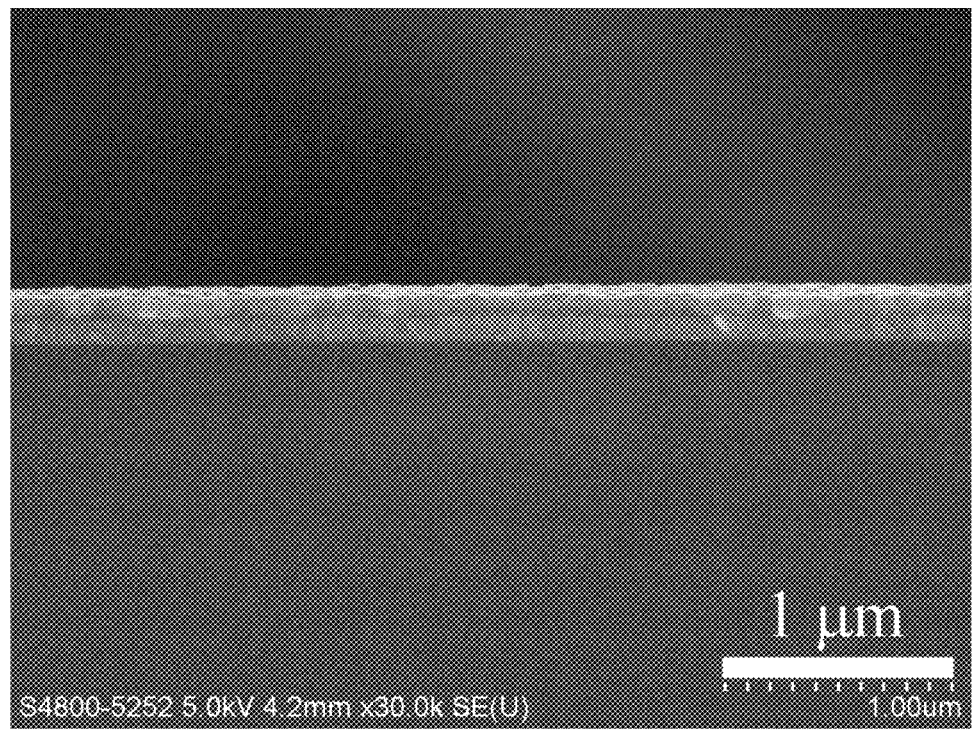
FIG. 1A is a cross-sectional Scanning Electron Microscope (SEM) image of flat methylammonium lead triiodide ($MAPbI_3$) thin film.

The invention provides a new solid-liquid-solid phase transformation ("SLSPT") approach to fabrication of perovskite periodic nanostructures with high crystal quality. In an illustrative embodiment, a method of forming a perovskite periodic nanostructure starts with preparing flat perovskite thin film on a substrate. The top surface of the perovskite thin film is covered with a periodic mold. Rather than press the mold into the flat thin film, a chemical is introduced to react with the solid perovskite in order to form a liquid intermediate. This liquid takes up the shape of the mold without pressing. After complete conversion into the liquid intermediate, the chemical is removed in order to convert the intermediate back into a solid perovskite. The solid will have the shape of the mold so that lifting up the mold reveals a perovskite periodic nanostructure. Before describing of the approach in detail, some specific terms need to be explained.

The term "SLSPT", as used herein, refers to solid-liquid-solid phase transformation, which indicates the phase change of perovskite during the fabrication. The flat perovskite thin film is in a solid state at the beginning and then becomes a liquid intermediate after reacting with an introduced chemical. Subsequently, the liquid intermediate returns back to a solid state after removal of the introduced chemical.

The term "perovskite", as used herein, refers to a semiconductor material with the general chemical formula of ABX$_3$;

where A is an organic cation of the formula $(R_1R_2R_3R_4Na)^+$;

where R$_1$ is hydrogen, unsubstituted or substituted C$_1$-C$_{10}$ alkyl;

where R$_2$ is hydrogen, unsubstituted or substituted C$_1$-C$_{10}$ alkyl;

where R$_3$ is hydrogen, unsubstituted or substituted C$_1$-C$_{10}$ alkyl;

where R$_4$ is hydrogen, unsubstituted or substituted C$_1$-C$_{10}$ alkyl;

where a can be any value between 1 and 10 (including 1 and 10).

B is at least one divalent metal cation; and

X is at least one halide anion.

As used herein, an alkyl group can be a substituted or unsubstituted, linear or branched chain saturated radical. It is often a substituted or an unsubstituted linear chain saturated radical, more often an unsubstituted linear chain saturated radical. A C1-C10 alkyl group is an unsubstituted or substituted, straight or branched chain saturated hydrocarbon radical having from 1 to 10 carbon atoms. Typically, it is C1-C10 alkyl, for example methyl, ethyl, propyl, butyl, pentyl, hexyl, heptyl, octyl, nonyl or decyl, or C1-C6 alkyl, for example methyl, ethyl, propyl, butyl, pentyl or hexyl, or C1-C4 alkyl, for example methyl, ethyl, i-propyl, n-propyl, t-butyl, s-butyl or n-butyl.

When an alkyl group is substituted it typically bears one or more substituents selected from substituted or unsubstituted C1-C10 alkyl, substituted or unsubstituted aryl, cyano, amino, C1-C10 alkylamino, di(C1-C10)alkylamino, arylamino, diarylamino, arylalkylamino, amido, acylamido, hydroxy, oxo, halo, carboxy, ester, acyl, acyloxy, C1-C20 alkoxy, aryloxy, haloalkyl, sulfonic acid, sulfhydryl (i.e. thiol, —SH), C1-C10 alkylthio, arylthio, sulfonyl, phosphoric acid, phosphate ester, phosphonic acid and phosphonate ester. Examples of substituted alkyl groups include haloalkyl, hydroxyalkyl, aminoalkyl, alkoxyalkyl and alkaryl groups. The term "alkaryl," as used herein, pertains to a C1-C20 alkyl group in which at least one hydrogen atom has been replaced with an aryl group. Examples of such groups include, but are not limited to, benzyl (phenylmethyl, PhCH$_2$—), benzhydryl (Ph$_2$CH—), trityl (triphenylmethyl, Ph$_3$C—), phenethyl (phenylethyl, Ph-CH$_2$CH$_2$—), styryl (Ph-CH=CH—), cinnamyl (Ph-CH=CH—CH$_2$—).

Typically, a substituted alkyl group carries 1, 2 or 3 substituents, for instance 1 or 2.

An aryl group is a substituted or unsubstituted, monocyclic or bicyclic aromatic group which typically contains from 6 to 14 carbon atoms, preferably from 6 to 10 carbon atoms in the ring portion. Examples include phenyl, naphthyl, indenyl and indanyl groups. An aryl group is unsubstituted or substituted. When an aryl group as defined above is substituted it typically bears one or more substituents selected from C$_1$-C$_6$ alkyl which is unsubstituted (to form an aralkyl group), aryl which is unsubstituted, cyano, amino, C1-C10 alkylamino, di(C1-C10)alkylamino, arylamino, diarylamino, arylalkylamino, amido, acylamido, hydroxy, halo, carboxy, ester, acyl, acyloxy, C1-C20 alkoxy, aryloxy, haloalkyl, sulfhydryl (i.e. thiol, —SH), C1-10 alkylthio, arylthio, sulfonic acid, phosphoric acid, phosphate ester, phosphonic acid and phosphonate ester and sulfonyl. Typically, it carries 0, 1, 2 or 3 substituents. A substituted aryl group may be substituted in two positions with a single C1-C6 alkylene group, or with a bidentate group represented by the formula —X—(C1-C6) alkylene, or —X—(C1-C6) alkylene-X—, wherein X is selected from O, S and NR, and wherein R is H, aryl or C1-C6 alkyl. Thus, a substituted aryl group may be an aryl group fused with a cycloalkyl group or with a heterocyclyl group. The ring atoms of an aryl group may include one or more heteroatoms (as in a heteroaryl group). Such an aryl group (a heteroaryl group) is a substituted or unsubstituted mono- or bicyclic heteroaromatic group which typically contains from 6 to 10 atoms in the ring portion including one or more heteroatoms. It is generally a 5- or 6-membered ring, containing at least one heteroatom selected from O, S, N, P, Se and Si. It may contain, for example, 1, 2 or 3 heteroatoms. Examples of heteroaryl groups include pyridyl, pyrazinyl, pyrimidinyl, pyridazinyl, furanyl, thienyl, pyrazolidinyl, pyrrolyl, oxazolyl, oxadiazolyl, isoxazolyl, thiadiazolyl, thiazolyl, isothiazolyl, imidazolyl, pyrazolyl, quinolyl and isoquinolyl. A heteroaryl group may be unsubstituted or substituted, for instance, as specified above for aryl. Typically, it carries 0, 1, 2 or 3 substituents.

Typically, the divalent metal cation may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$. Usually, the divalent metal cation is selected from $Sn^{2+}$ and $Pb^{2+}$.

In general, the perovskites are selected from $CH_3NH_3PbI_3$, $CH_3NH_3PbBr_3$, $CH_3NH_3PbCl_3$, $CH_3NH_3PbF_3$, $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$, $CH_3NH_3SnF_2Cl$, $HC(NH_2)_2PbI_3$, $HC(NH_2)_2PbBr_3$, $HC(NH_2)_2PbCl_3$, $HC(NH_2)_2PbF_3$, $HC(NH_2)_2PbBrI_2$, $HC(NH_2)_2PbBrCl_2$, $HC(NH_2)_2PbIBr_2$, $HC(NH_2)_2PbClBr_2$, $HC(NH_2)_2PbI_2Cl$, $HC(NH_2)_2PbICl_2$, $HC(NH_2)_2SnI_3$, $HC(NH_2)_2SnBr_3$, $HC(NH_2)_2SnCl_3$, $HC(NH_2)_2SnF_3$, $HC(NH_2)_2SnBrI_2$, $HC(NH_2)_2SnBrCl_2$, $HC(NH_2)_2SnIBr_2$, $HC(NH_2)_2SnClBr_2$, $HC(NH_2)_2SnI_2Cl$, and $HC(NH_2)_2SnICl_2$. For instance, in the optoelectronic device of the invention, the perovskites may be selected from $CH_3NH_3PbI_3$, $CH_3NH_3PbBr_3$, $CH_3NH_3PbCl_3$, $CH_3NH_3PbF_3$, $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$, $CH_3NH_3SnF_2Cl$, $HC(NH_2)_2PbI_3$, $HC(NH_2)_2PbBr_3$, $HC(NH_2)_2PbCl_3$, $HC(NH_2)_2PbF_3$, $HC(NH_2)_2PbBrI_2$, $HC(NH_2)_2PbBrCl_2$, $HC(NH_2)_2PbIBr_2$, $HC(NH_2)_2PbClBr_2$, $HC(NH_2)_2PbI_2Cl$, $HC(NH_2)_2PbICl_2$, $HC(NH_2)_2SnI_3$, $HC(NH_2)_2SnBr_3$, $HC(NH_2)_2SnCl_3$, $HC(NH_2)_2SnF_3$, $HC(NH_2)_2SnBrI_2$, $HC(NH_2)_2SnBrCl_2$, $HC(NH_2)_2SnIBr_2$, $HC(NH_2)_2SnClBr_2$, $HC(NH_2)_2SnI_2Cl$, and $HC(NH_2)_2SnICl_2$. Typically, the perovskite is selected from $CH_3NH_3PbI_3$, $CH_3NH_3PbBr_3$, $CH_3NH_3PbCl_3$, $CH_3NH_3PbF_3$, $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnF_2Br$, $CH_3NH_3SnICl_2$, $CH_3NH_3SnF_2I$, $CH_3NH_3SnI_2Cl$, $CH_3NH_3SnF_2Cl$, $HC(NH_2)_2PbI_3$, $HC(NH_2)_2PbBr_3$, $HC(NH_2)_2PbCl_3$, $HC(NH_2)_2PbF_3$, $HC(NH_2)_2PbBrI_2$, $HC(NH_2)_2PbBrCl_2$, $HC(NH_2)_2PbIBr_2$, $HC(NH_2)_2PbClBr_2$, $HC(NH_2)_2PbI_2Cl$, $HC(NH_2)_2PbICl_2$, $HC(NH_2)_2SnI_3$, $HC(NH_2)_2SnBr_3$, $HC(NH_2)_2SnCl_3$, $HC(NH_2)_2SnF_3$, $HC(NH_2)_2SnBrI_2$, $HC(NH_2)_2SnBrCl_2$, $HC(NH_2)_2SnIBr_2$, $HC(NH_2)_2SnClBr_2$, $HC(NH_2)_2SnI_2Cl$, and $HC(NH_2)_2SnICl_2$. More typically, the perovskite is selected from $CH_3NH_3PbI_3$, $CH_3NH_3PbBr_3$, $CH_3NH_3PbCl_3$, $CH_3NH_3PbF_3$, $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnF_2Br$, $CH_3NH_3SnF_2I$ and $CH_3NH_3SnF_2Cl$. Usually, the perovskite is selected from $CH_3NH_3PbI_3$, $CH_3NH_3PbBr_3$, $CH_3NH_3PbCl_3$, $CH_3NH_3PbIBr_2$, $CH_3NH_3PbICl_2$, $CH_3NH_3SnF_2Br$, $CH_3NH_3SnF_2I$, $HC(NH_2)_2PbI_3$, $HC(NH_2)_2PbBr_3$, $HC(NH_2)_2PbCl_3$, $HC(NH_2)_2PbF_3$, $HC(NH_2)_2PbBrI_2$, $HC(NH_2)_2PbBrCl_2$, $HC(NH_2)_2PbIBr_2$, $HC(NH_2)_2PbClBr_2$, $HC(NH_2)_2PbI_2Cl$, $HC(NH_2)_2PbICl_2$, $HC(NH_2)_2SnI_3$, $HC(NH_2)_2SnBr_3$, $HC(NH_2)_2SnCl_3$, $HC(NH_2)_2SnF_3$, $HC(NH_2)_2SnBrI_2$, $HC(NH_2)_2SnBrCl_2$, $HC(NH_2)_2SnIBr_2$, $HC(NH_2)_2SnClBr_2$, $HC(NH_2)_2SnI_2Cl$, and $HC(NH_2)_2SnICl_2$.

The term "periodic nanostructures", or "periodic arrays", as used herein, refers to repeated units in nanoscale with a certain period. It can be a one-dimensional periodic nanostructure or a two-dimensional pillar or hole.

The term "mold", or "periodic mold", as used herein is made from one of PDMS, PMMA, Silicon, Nickel, or Silicon dioxide. It can be one dimensional periodic nanostructure with any period or two-dimensional hole or pillar structure with any configuration.

First, an exemplary method of forming a flat perovskite thin film utilizes a reported one-step solvent engineering approach. See, N. J. Jeon, J. H. Noh, Y. C. Kim, W. S. Yang, S. Ryu and S. I. Seok, *Nat Mater,* 2014, 13, 897-903, which is incorporated herein by reference in its entirety. This approach is one of the most reported methods for fabricating smooth perovskite thin film with high-quality crystal. This approach starts with dissolving lead halide and organic halide simultaneously in a combinational solvent of dimethyl sulfoxide (DMSO) and gamma-butyrolactone (GBL). Subsequently this solution is spin coated on a substrate. During coating, a weak polar solvent (such as toluene, or chlorobenzene, or 1, 2-dichlorobenzene) is dripped on the substrate. The spin coated substrate is then annealed to form a flat perovskite thin film. It should be noticed that, the method for fabrication of the flat perovskite thin film is not limited to the one-step solvent engineering approach. Other approaches, including but not limited to two-step sequential deposition, dual-source thermal evaporation, and doctor blading, can also be utilized to fabricate flat perovskite thin film. Any of these formed perovskite thin films is suitable for the SLSPT approach to fabrication of perovskite periodic nanostructure.

The substrate on which the flat perovskite thin film is deposited can be rigid or flexible. The rigid substrate can be chosen from glass, silicon, ITO coated glass, fluorine-doped tin oxide (FTO) coated glass, and any thereof coated with semiconductor material. On the other hand, the flexible substrate can be ITO coated polyethylene terephthalate (PET), ITO coated polyethylene-naphthalate (PEN), ITO coated polyimide (PI), FTO coated PET, FTO coated PEN, and FTO coated PI, and any thereof coated with semiconductor material.

Second, the perovskite thin film is covered with a periodic mold. An exemplary embodiment of a mold is a one-dimensional periodic nanostructure on polydimethylsiloxane (PDMS). For example, a PDMS periodic nanostructure with a period of 735 nm is used to fabricate a $MAPbI_3$ periodic nanostructure. However, other molds, including but not limited to quartz, silicon, silicon oxide, nickel, and poly(methyl methacrylate) (PMMA) can also be suitable for the SLSPT approach. It should be noted that, to form better contact between the perovskite thin film and the mold, the use of soft molds, such as PMMA and PDMS, is suggested.

Subsequently, to convert the solid perovskite thin film into a liquid state in order to replicate the pattern on the mold, a chemical is introduced. The introduced chemical reacts with perovskite and forms a liquid intermediate, accompanied with a color change of the perovskite. This is one of a crucial part of the SLSPT approach. The recipe for choosing a chemical should satisfy following requirements: First, the chemical must react with perovskite to form a liquid intermediate. Second, the intermediate must decompose into perovskite and other byproducts. In general, the chemical can be nitrogen-containing compound, such as amines. These amines include monoamines, diamines, triamines and polyamines. Specific examples of monoamines added include aliphatic monoamines such as methylamine, ethylamine, propylamine, butylamine, pentylamine, hexylamine, heptylamine, octylamine, 2-ethylhexylamine, nonylamine, decylamine, undecylamine, dodecylamine, tridecylamine, tetradecylamine, pentadecylamine, hexadecylamine, octadecylamine, octadecyleneamine, eicosylamine or docosylamine, alicyclic monoamines such as cyclohexylamine or methylcyclohexylamine, aromatic monoamines such as benzylamino or β-phenylmethylamine, symmetrical secondary amines such as N,N-dimethylamine, N,N-diethylamine, N,N-dipropylamine, N,N-dibutylamine, N,N-dihexylamine or N,N-dioctylamine, and mixed secondary amines such as N-methyl-N-ethylamine, N-methyl-N-butylamine, N-methyl-N-dodecylamine, N-methyl-N-octadecylamine, N-ethyl-N-hexadecylamine, N-ethyl-N-octadecylamine, N-propyl-N-hexadecylamine or N-propyl-N-benzylamine. The chemical can be any one selected from the group consisting of ammonia, methylamine, formamidine, ethylamine, n-butylamine, tert-butylamine, octylamine etc. An exemplary embodiment of a chosen chemical is methylamine (MA) gas. MA gas is produced by heating its solution in water and purifying the gas with a drier. The MA gas reacts with solid methylammonium lead triiodide ($MAPbI_3$) and forms the liquid intermediate of $MAPbI_3$.MA. Other than the change of state from solid to liquid, the color of perovskite changes from brown to transparent. This is the indication of the completion of the reaction. The time for compete conversion of perovskite into the intermediate depends on the heating temperature of MA and the number of perovskite thin film devices. In general, the higher the temperature and the fewer perovskite devices, reduces the time. Usually, the reaction time is within ten minutes.

As part of the SLSPT process, the chemical must be removed from the intermediate in order to covert the liquid intermediates into solid perovskite. The chemical can be removed by annealing or volatilization at room temperature. The heating temperature can be any value between 25° C. and 150° C. The higher the temperature, the shorter the time required for complete conversion. Besides, a higher temperature results in better crystallization of perovskite. However, a temperature higher than 100° C. might decompose the perovskite. As a result, the preferred annealing temperature should be in the range of 80° C. to 100° C. After complete conversion, the liquid intermediate turns back into solid perovskite, accompanied with the replication of the pattern from the mold.

Moreover, the prepared perovskite periodic nanostructure can be used in different optoelectronic devices, such as solar cells, LEDs, laser diodes, transistors, and photodetectors. An exemplary embodiment of the application of a prepared perovskite periodic nanostructure is in a perovskite LED. In general, an LED device comprises a bottom electrode, a hole transporting layer, an emissive layer, an electron transporting layer, and a top electrode. For example, the bottom electrode can be ITO or FTO on a rigid or flexible substrate, and the top electrode can be aluminum (Al), silver (Ag), or gold (Au). The hole transporting layer can be chosen from PEDOT:PSS and $NiO_x$. The electron transporting layer can be phenyl-C61-butyric acid methyl ester ($PC_{61}BM$), $C_{60}$, ZnO, and $SnO_x$. The PEDOT:PSS and $PC_{61}BM$ thin film can be formed via spin coating and doctor blading. C60 thin film could also be deposited through spin coating and thermal evaporation. Besides, $NiO_x$, ZnO, and $SnO_x$ thin films could be prepared via spin coating, doctor blading, and atomic layer deposition. Finally, the Al, Ag, or Au electrode could be deposited via thermal evaporation.

Following are examples of the present invention to illustrate the SLSPT approach for fabrication of perovskite periodic nanostructures.

EXAMPLE 1

Perovskite Periodic Nano Structure Fabrication and Characterization

A $MAPbI_3$ periodic nanostructure with a period of 735 nm was prepared using the SLSPT approach. At the beginning, a flat thin film was prepared using the one-step solvent engineering approach. More specifically, 0.5 mol/1 precursor of $PbI_2$/MAI (molar ratio=1:1) in a combinational solvent of DMSO/GBL (v/v=3:7) was heated at 80° C. for 1 hour and then spin coated on to a PEDOT:PSS/ITO substrate at a speed of 1000 rpm for a first duration of 10 seconds and then 5000 rpm for a second duration of 40 s. Toluene was dripped on to the spin coating substrate at 17 s of the second duration (also at 27 s of the whole coating time). After coating, the substrate was baked at 100° C. for 10 min, which led to the formation of flat $MAPbI_3$ thin film. The above process was completed in a laboratory glove box.

A mold with a period of 735 nm was prepared by transfer from a periodic nanostructure by photolithography and it was placed on the prepared flat $MAPbI_3$ thin film. The $MAPbI_3$ thin film with the PDMS mold atop was transferred, perhaps in a plastic bag, into a chamber where dry gaseous MA was prepared by heating its aqueous solution at 60° C. The MA gas was dried with calcium oxide (CaO) powder and then introduced to the perovskite thin film. After less than 10 min of MA gas treatment, brown $MAPbI_3$ became transparent, indicating formation of a liquid intermediate of $MAPbI_3$.MA. Subsequently, the device was brought back to the glove box, followed by annealing at 100° C. for 5 min. The color of the device gradually changed from transparent to brown during annealing, indicating the conversion of $MAPbI_3$.MA to $MAPbI_3$. When the PDMS mold was lifted off, the $MAPbI_3$ periodic nanostructure was revealed.

Figure 1B:
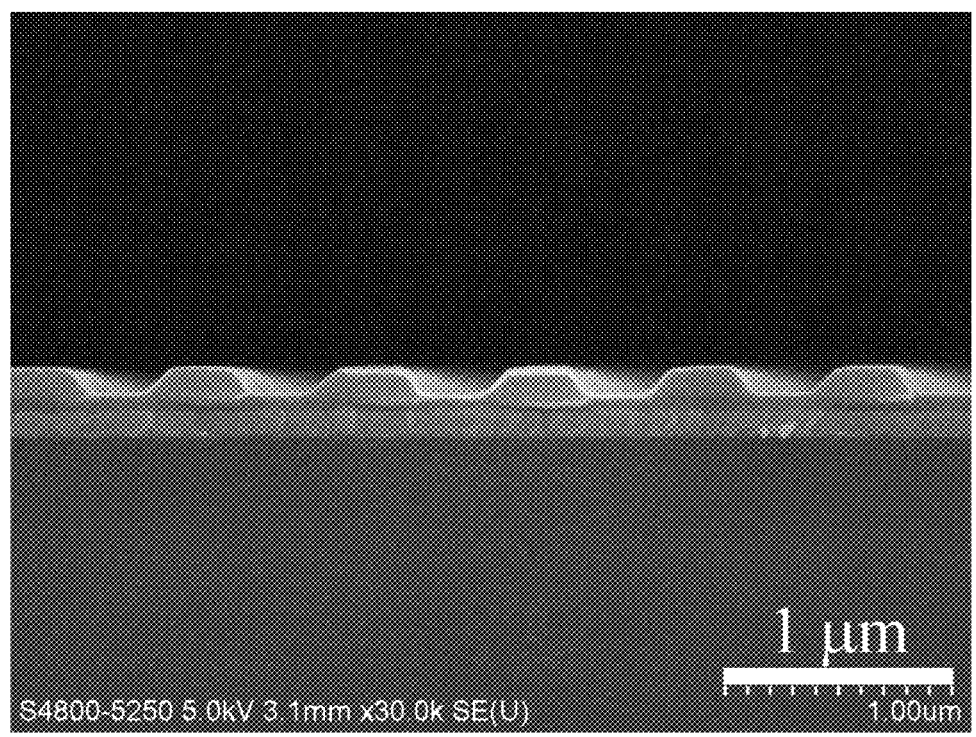
FIG. 1B is a cross-sectional SEM image of a $MAPbI_3$ periodic nanostructure with a period of 735 nm.
Figure 1C:
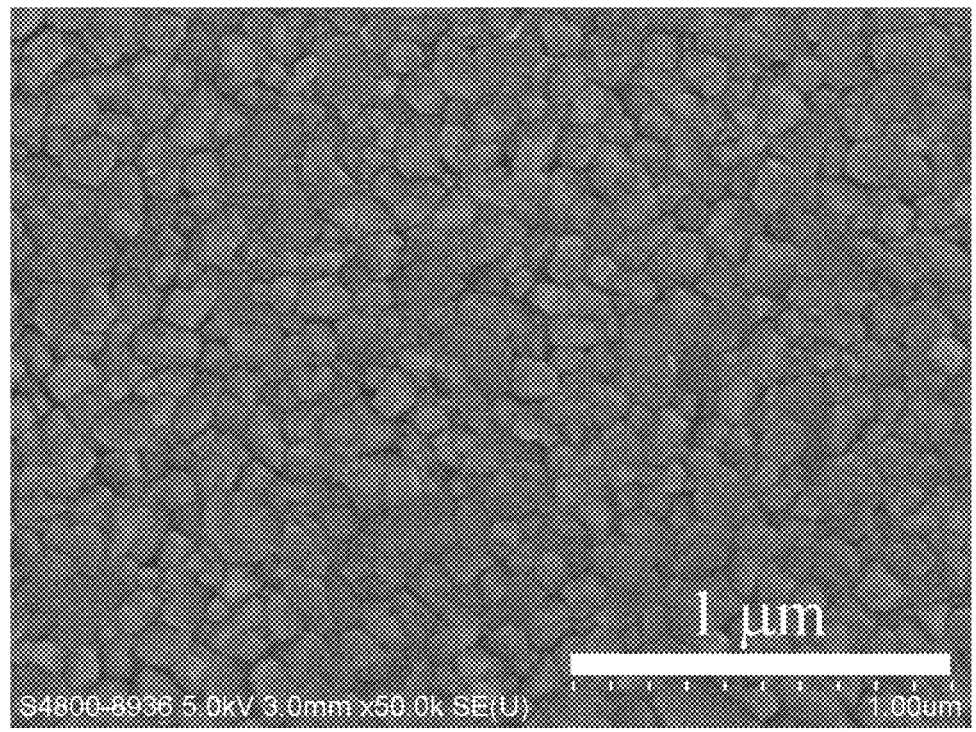
FIG. 1C is a top-view SEM image of a flat $MAPbI_3$ thin film.
Figure 1D:
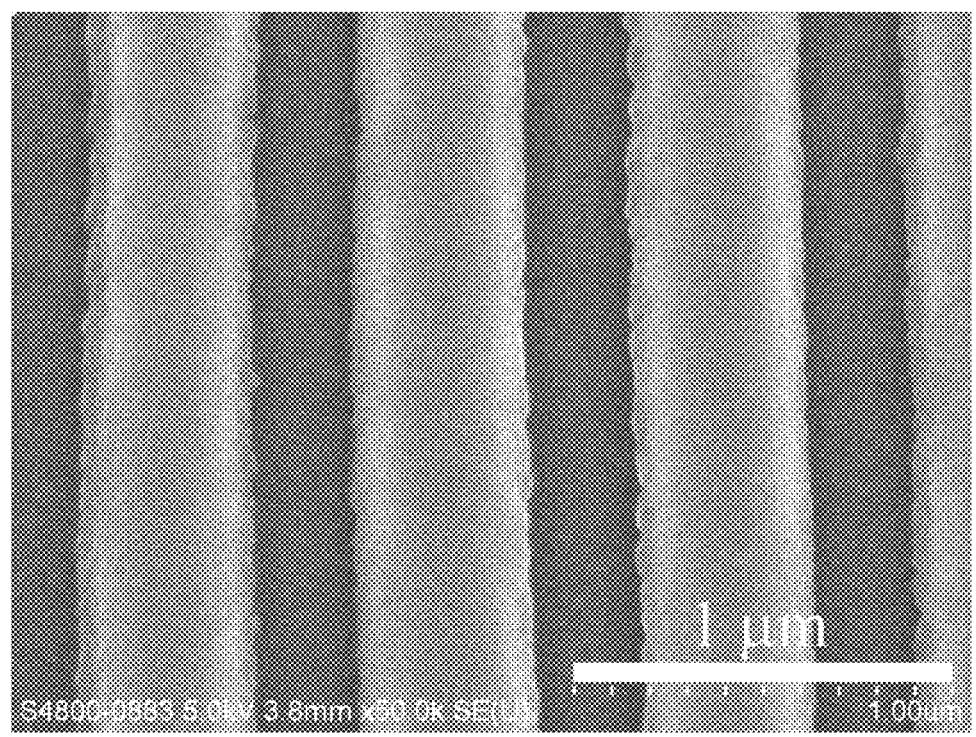
FIG. 1D is a top-view SEM image of a MAPbI$_3$ periodic nanostructure with a period of 735 nm.
Figure 1E:
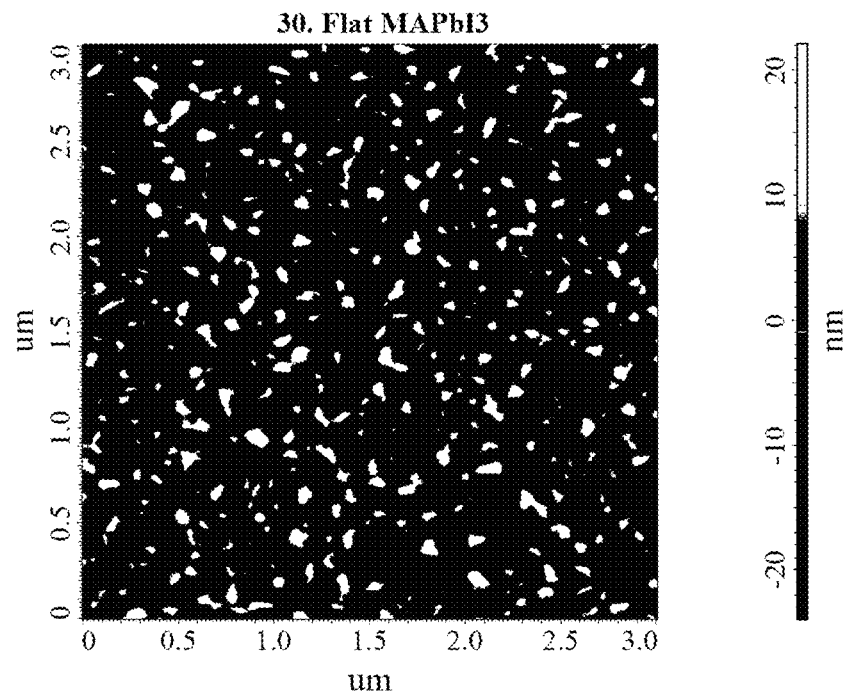
FIG. 1E is an Atomic Force Microscopy (AFM) image of a flat MAPbI$_3$ thin film.
Figure 1F:
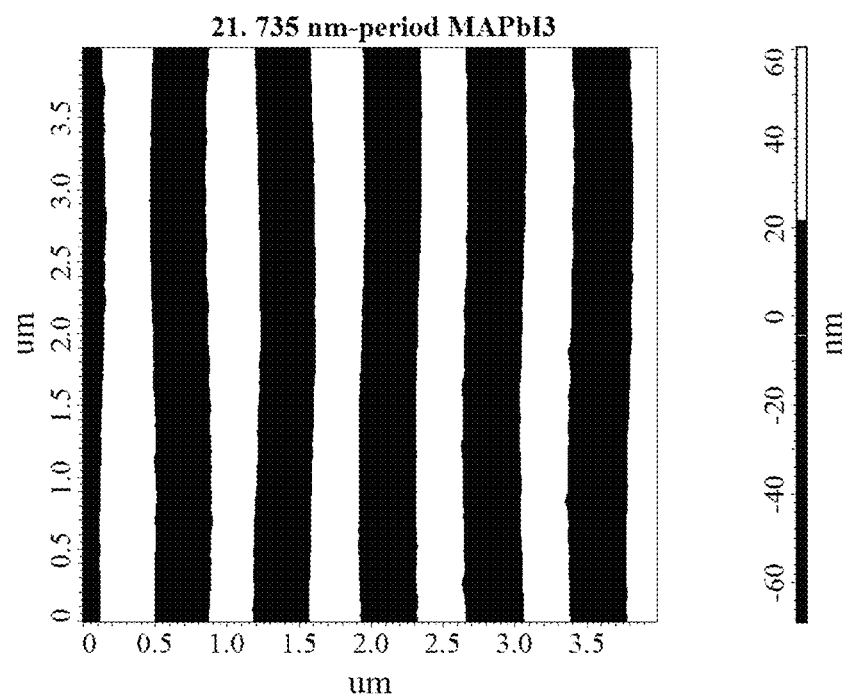
FIG. 1F is an AFM image of a MAPbI$_3$ periodic nanostructure with a period of 735 nm.
Figure 1G:
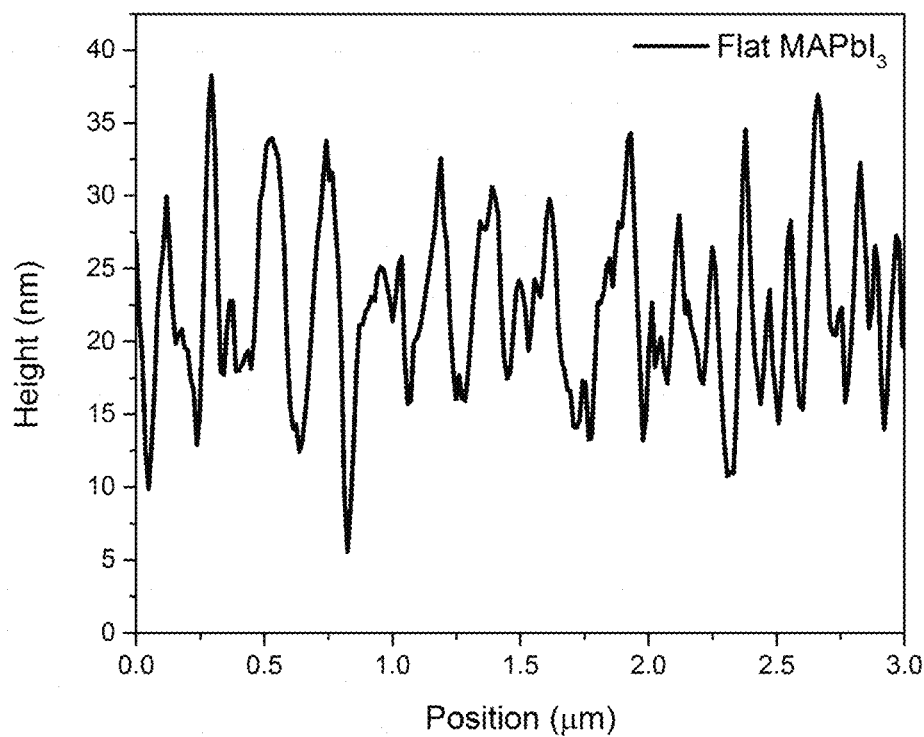
FIG. 1G is an AFM height profile of a flat MAPbI$_3$ thin film.
Figure 1H:
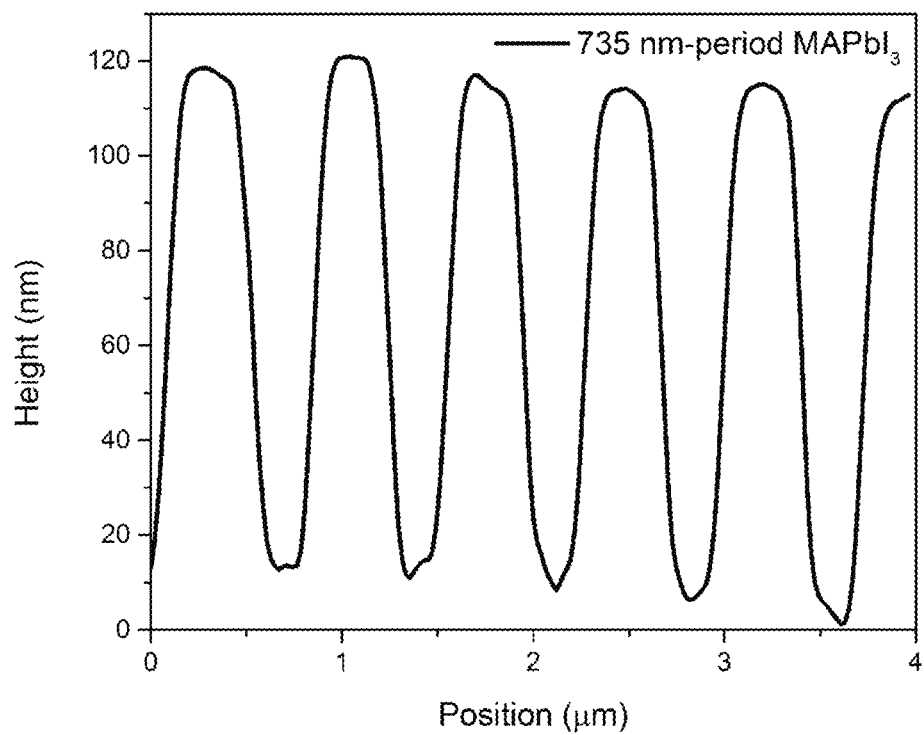
FIG. 1H is an AFM height profile of a MAPbI$_3$ periodic nanostructure with a period of 735 nm.
Figure 2:
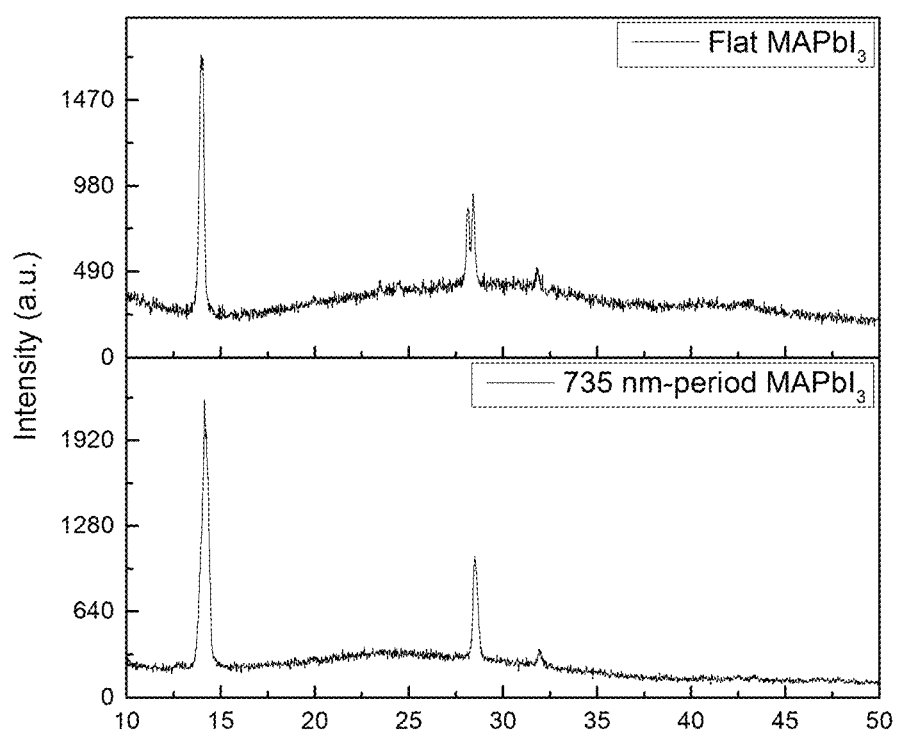
FIG. 2 is an X-ray Diffraction (XRD) spectrum of a flat MAPbI$_3$ thin film and a MAPbI$_3$ periodic nanostructure with a period of 735 nm.
Figure 3:
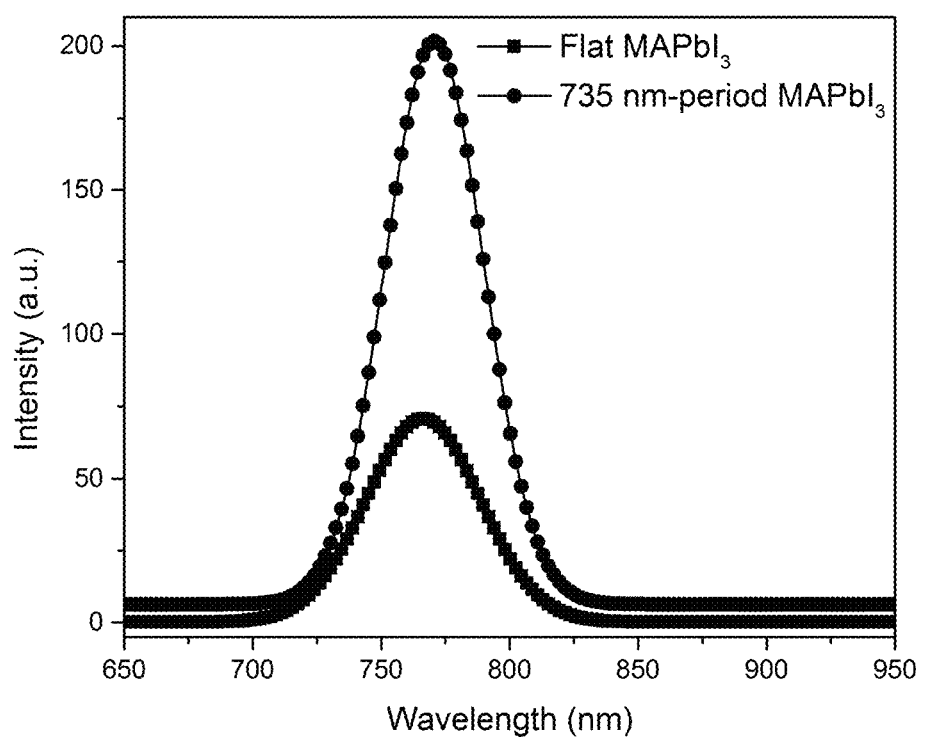
FIG. 3 is a photoluminescence (PL) spectra of a flat MAPbI$_3$ thin film and a MAPbI$_3$ periodic nanostructure with a period of 735 nm.

As can be seen from FIGS. 1A, 1C, and 1E, the flat $MAPbI_3$ thin film from the one-step solvent engineering approach was quite smooth with root mean square (RMS) roughness of 6.28 nm. After being patterned, the flat $MAPbI_3$ thin film formed a satisfactory periodic nanostructure with a period of 735 nm, as shown in FIGS. 1B, 1D, 1F. Besides, the grain boundary which was obvious in the flat thin film (FIG. 1C) was invisible in the patterned device (FIG. 1D), which indicated that the patterned $MAPbI_3$ might have single crystal properties. What's more, an interesting phenomenon was that the depth of $MAPbI_3$ changed from 60-80 nm in the flat thin film to 100-120 nm after forming the periodic nanostructure. This could be understood as the $MAPbI_3$ previously located at the space region being pushed to the line region by the PDMS mold, resulting in an increased thickness of line region. The crystal quality of $MAPbI_3$ before and after being patterned was investigated by XRD technique. See FIG. 2 which shows that the characteristic peaks of reported MAPbI$_3$ were observed in the flat MAPbI$_3$ device at 13.95°, 28.38°, and 31.74°, which corresponded to (110), (220), and (310) lattice phase. After being patterned, the MAPbI$_3$ exhibited a higher intensity in the XRD spectrum at lattice phase of (110) and (220) compared with the flat one, indicating better crystal quality for the MAPbI$_3$ periodic nanostructure. The increased crystal quality can be explained by the reported defect healing of MA to MAPbI$_3$. In addition, as shown in FIG. 3, the improved photoluminescence (PL) of the 735 nm-period MAPbI$_3$ device in comparison to the flat one could be attributed to the improved crystal quality of the MAPbI$_3$ periodic nanostructure and the light out coupling of the periodic nanostructure.

Figure 5A:
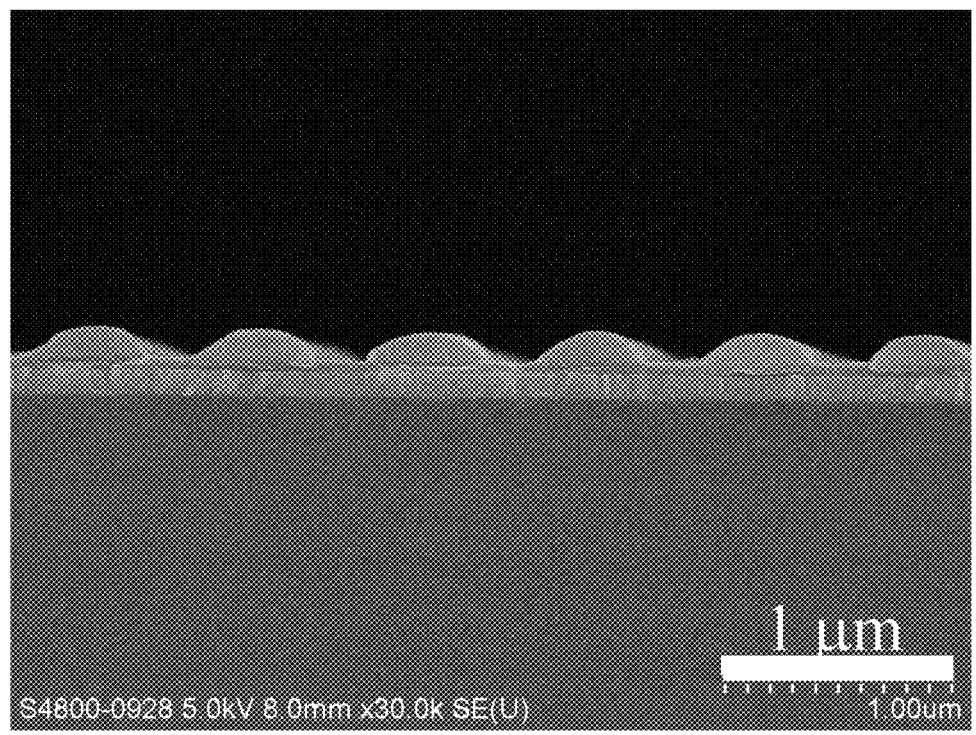
FIG. 5A is a cross-sectional SEM image of a formamidinium lead triiodide (FAPbI$_3$) periodic nanostructure with 735 nm.
Figure 5B:
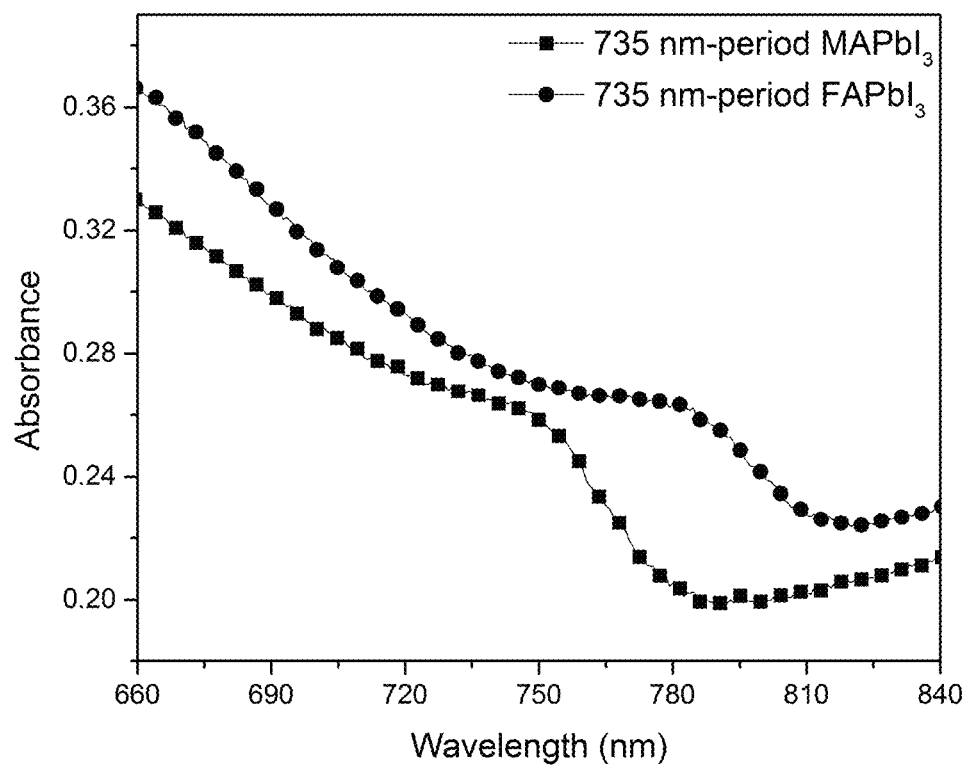
FIG. 5B is an absorbance spectrum of a MAPbI$_3$ periodic nanostructure with a period of 735 nm and a FAPbI$_3$ periodic nanostructure with a period of 735 nm.

A FAPbI$_3$ periodic nanostructure can be fabricated by cation exchange of the MAPbI$_3$ periodic nanostructure by dipping MAPbI$_3$ in a FAI solution as described in the article, G. E. Eperon, C. E. Beck and H. J. Snaith, *Mater Horiz*, 2016, 3, 63-71, which is incorporated herein by reference in its entirety. After 5 min cation exchange, the sharp edge in the MAPbI$_3$ periodic nanostructure becomes much smoother, as shown in FIG. 5A. However, the line depth and width are almost the same for MAPbI$_3$ and the FAPbI$_3$ periodic nanostructure, which demonstrates the feasibility of fabricating a FAPbI$_3$ periodic nanostructure from a MAPbI$_3$ periodic nanostructure. Besides, the absorbance onset is red shifted from 780 nm in the MAPbI$_3$ periodic nanostructure to 810 nm in the FAPbI$_3$ periodic nanostructure, as shown in FIG. 5B. The red-shifted absorption onset originates from the lower band gap of FAPbI$_3$ (Eg=1.45 eV), in comparison to that of MAPbI$_3$ with Eg of 1.5 eV.

MAPbI$_3$ Periodic Nanostructure LED Fabrication and Characterization

Figure 6A:
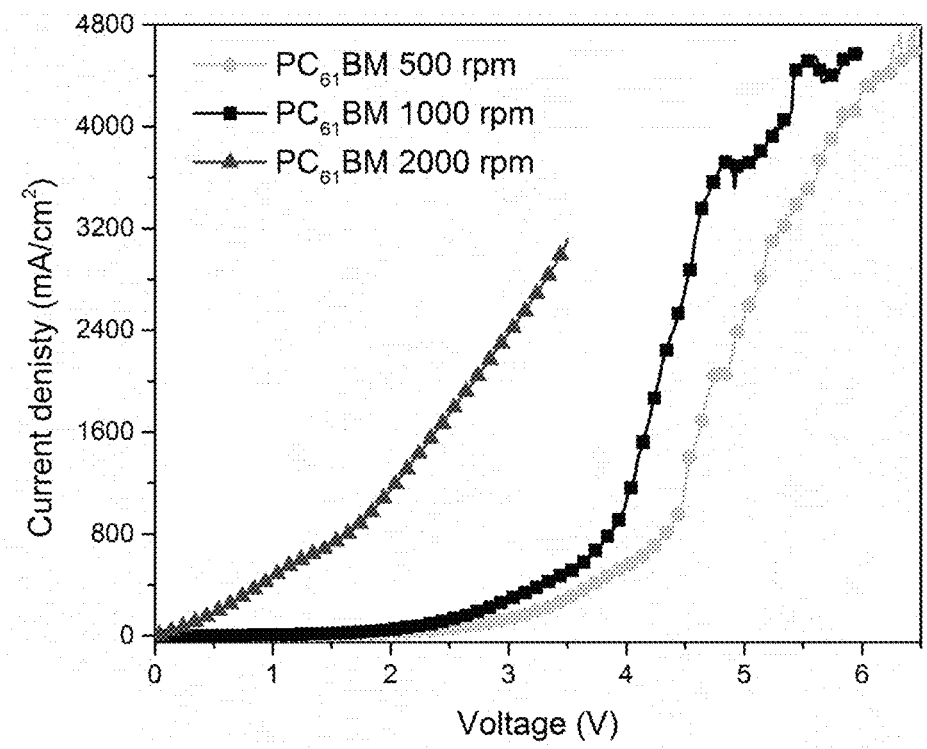
FIG. 6A is a graph of voltage-current density characteristics of a flat MAPbI$_3$ light emitting diode (LED) with different spin coating rates for phenyl-C61-butyric acid methyl ester (PC$_{61}$BM)
Figure 6B:
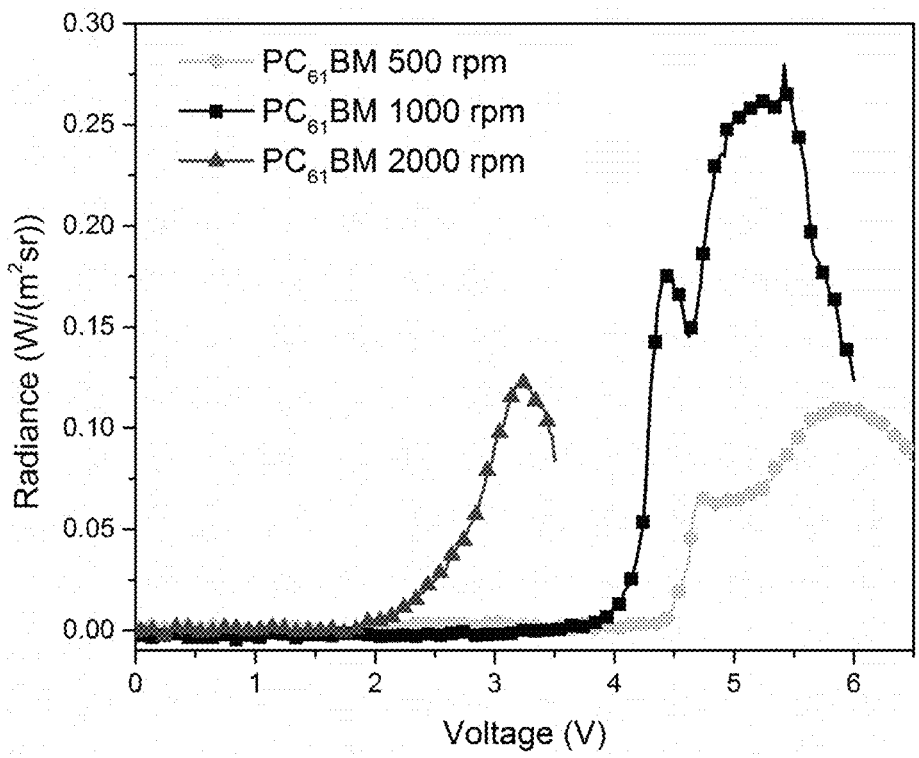
FIG. 6B is a graph of voltage-radiance characteristics of a flat MAPbI$_3$ LED with different spin coating rates for PC$_{61}$BM.
Figure 6C:
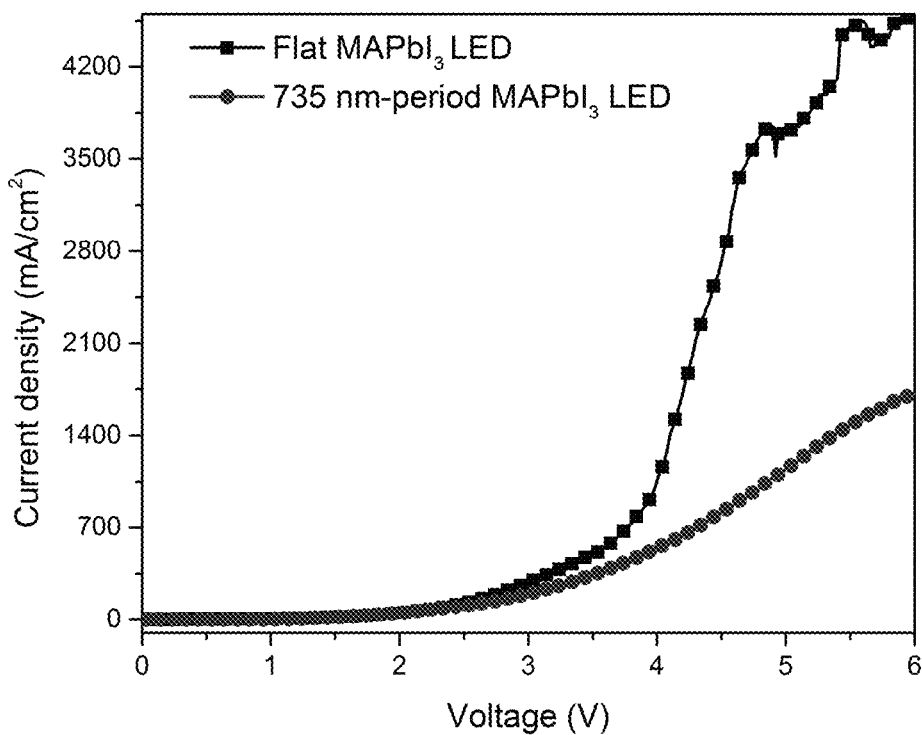
FIG. 6C is a graph of voltage-current density characteristics of a flat MAPbI$_3$ LED and a 735 nm-period MAPbI$_3$ LED.
Figure 6D:
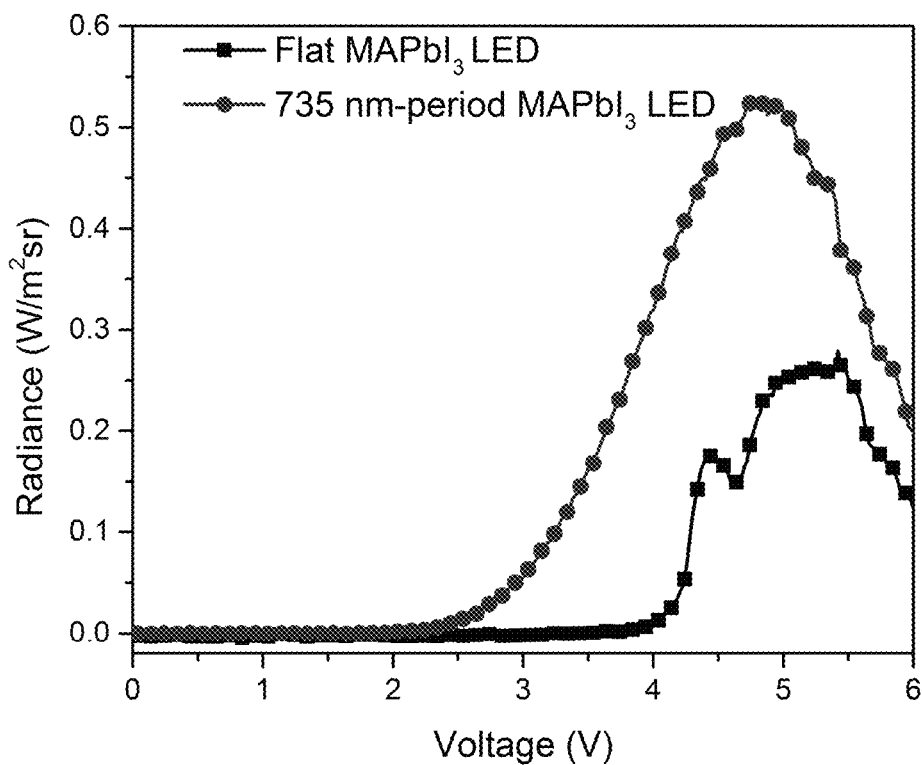
FIG. 6D is a graph of voltage-radiance characteristics of a flat MAPbI$_3$ LED and a 735 nm-period MAPbI$_3$ LED.

The MAPbI$_3$ periodic nanostructure was manufactured into an LED and compared with a flat MAPbI$_3$ LED. The structure of the MAPbI$_3$ LED is ITO/PEDOT:PSS/MAPbI$_3$/PC$_{61}$BM/Ag. First, ITO coated glass was successively cleaned with detergent, water, acetone, and ethanol. After treatment with ultraviolet-ozone (UVO) for 10-15 min, the ITO glass was spin coated with PEDOT:PSS at rate of 2,500-4,000 rpm and annealed at 100° C.-130° C. for 5-10 min. The MAPbI$_3$ periodic nanostructure with a period of 735 nm was fabricated on PEDOT:PSS via the above SLSPT approach. The device with the flat MAPbI$_3$ thin film was used as a reference. PC$_{61}$BM in 1, 2-Dichlorobenzene (DCB) was spin coated on the MAPbI$_3$ periodic nanostructure and thin film, followed by thermal evaporation of 100 nm Ag. For the flat MAPbI$_3$ device, PC$_{61}$BM was dissolved in DCB with a concentration of 20 mg/ml. The spin coating rate of PC$_{61}$BM was investigated to obtain optimized electroluminescence. FIGS. 6A and 6B show the voltage-current density characteristic and voltage-radiance of the flat MAPbI$_3$ LED under different spin coating rates for the PC$_{61}$BM. The optimal spin coating rate of 1000 rpm for PC$_{61}$BM resulted in a radiance of 0.27 W/(m$^2$sr) for the flat MAPbI$_3$ LED. As for the device with the MAPbI$_3$ periodic nanostructure, PC$_{61}$BM was dissolved in DCB with a concentration of 30 mg/ml and its spin coating rate was as low as 500 rpm in order to fully cover the perovskite. The radiance of the LED with the 735 nm-period MAPbI$_3$ reached 0.52 W/(m$^2$sr), which was approximately two times that of the flat MAPbI$_3$ LED, as shown in FIG. 6D. This increased electroluminescence in the MAPbI$_3$ LED with the periodic nanostructure matched well with the improved PL in the MAPbI$_3$ periodic nanostructure. The improvement can be attributed to the improved crystal quality of perovskite after being patterned, and the light output coupling of the periodic nanostructure.

EXAMPLE 2

Figure 4A:
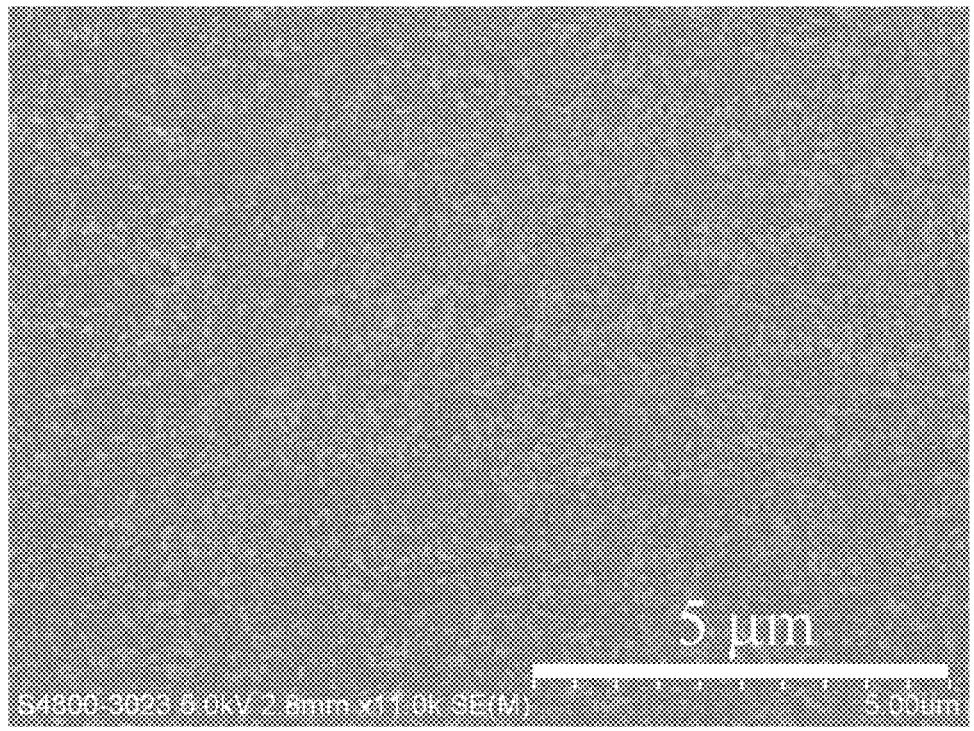
FIG. 4A is a top-view SEM image of a flat MAPbI$_3$ thin film.
Figure 4B:
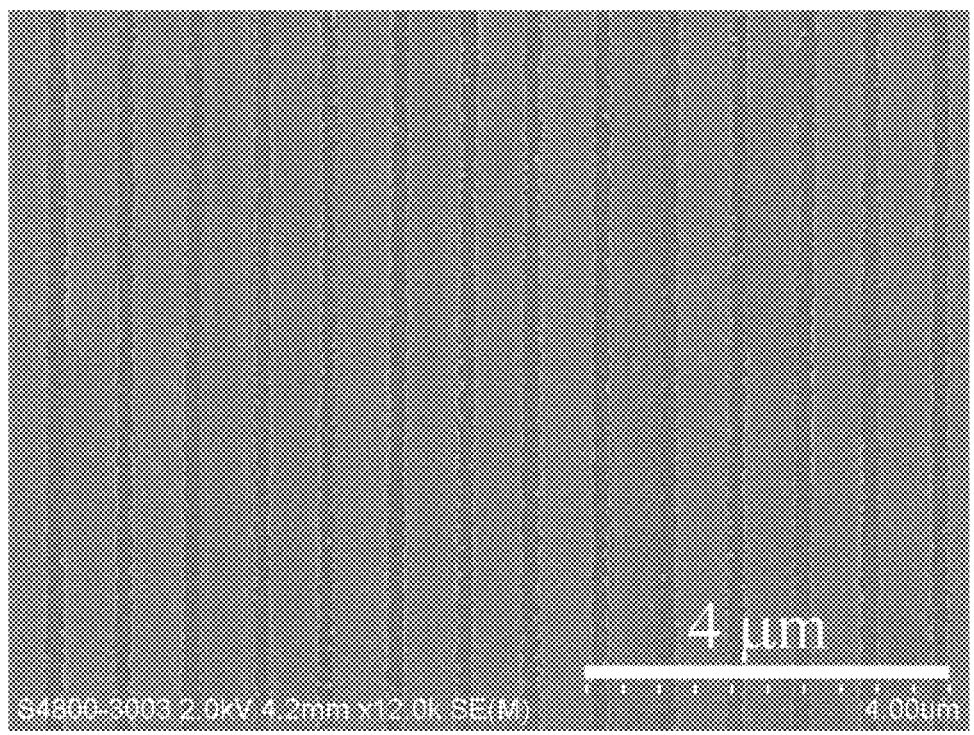
FIG. 4B is a top-view SEM image of a MAPbI$_3$ periodic nanostructure with a period of 735 nm.

Another method for fabrication of flat MAPbI$_3$ thin film was investigated and utilized to fabricate a MAPbI$_3$ periodic nanostructure. More specifically, 0.15 mol/l precursor of PbI$_2$/MAI (molar ratio=1:1) was dissolved in dimethylformamide (DMF). After complete dissolution, the precursor was spin coated on to a PEDOT:PSS/ITO substrate with a speed of 5000 rpm for 50 seconds. After coating, the substrate was annealed at 100° C. for 10 min. A PDMS mold with a period of 735 nm was placed on a prepared flat MAPbI$_3$ thin film. The MAPbI$_3$ thin film with a PDMS mold atop was transferred into a chamber where dry gaseous MA was prepared through heating its aqueous solution at 60° C. The MA gas was dried with CaO powder and then introduced to the perovskite thin film. After less than 10 min of MA gas treatment, brown MAPbI$_3$ became transparent. Subsequently, the device was brought back to the glove box, followed by annealing at 100° C. for 5 min. After removal of the PDMS mold, the MAPbI$_3$ periodic nanostructure was revealed. FIGS. 4A and 4B show the MAPbI$_3$ thin film from this method and its corresponding MAPbI$_3$ periodic nanostructure with a period of 735 nm. It also should be noticed that the small crystals in the thin film disappeared after forming the MAPbI$_3$ periodic nanostructure.

The present invention has been described herein using molds having a period of 735 nm. However, the present invention would also work successfully using molds with other periods, e.g. 1500 nm.

While the present invention has been particularly shown and described with reference to preferred embodiments thereof; it will be understood by those skilled in the art that various changes in form and details may be made therein without departing from the spirit and scope of the invention.

What is claimed is:

1. A method of fabricating perovskite periodic nanostructures comprising:
   forming a perovskite thin film on a substrate;
   covering the perovskite thin film with a periodic mold having a nanostructure pattern;
   converting the perovskite into a liquid intermediate by reacting it with a chemical;
   recovering the liquid intermediate into solid perovskite by removing the introduced chemical; and
   removing the mold.

2. The method according to claim 1, wherein the perovskite has a general formula of ABX$_3$,
   where A is an organic cation;
   where B is at least one divalent metal cation, preferably selected from Ca$^{2+}$, Sr$^{2+}$, Cd$^{2+}$, Cu$^{2+}$, Ni$^{2+}$, Mn$^{2+}$, Fe$^{2+}$, Co$^{2+}$, Pd$^{2+}$, Ge$^{2+}$, Sn$^{2+}$, Pb$^{2+}$, Yb$^{2+}$ and Eu$^{2+}$; and
   where X is at least one halide anion, and preferably the perovskite is selected from CH$_3$NH$_3$PbI$_3$, CH$_3$NH$_3$PbBr$_3$, CH$_3$NH$_3$PbCl$_3$, CH$_3$NH$_3$PbF$_3$, CH$_3$NH$_3$PbBrI$_2$, CH$_3$NH$_3$PbBrCl$_2$, CH$_3$NH$_3$PbIBr$_2$, CH$_3$NH$_3$PbICl$_2$, CH$_3$NH$_3$PbClBr$_2$, CH$_3$NH$_3$PbI$_2$Cl, CH$_3$NH$_3$SnBrI$_2$, CH$_3$NH$_3$SnBrCl$_2$, CH$_3$NH$_3$SnF$_2$Br, CH$_3$NH$_3$SnIBr$_2$, CH$_3$NH$_3$SnICl$_2$, CH$_3$NH$_3$SnF$_2$I, CH$_3$NH$_3$SnClBr$_2$, CH$_3$NH$_3$SnI$_2$Cl, CH$_3$NH$_3$SnF$_2$Cl, HC(NH$_2$)$_2$PbI$_3$, HC(NH$_2$)$_2$PbBr$_3$, HC(NH$_2$)$_2$PbCl$_3$, HC(NH$_2$)$_2$PbF$_3$, HC(NH$_2$)$_2$PbBrI$_2$, HC(NH$_2$)$_2$PbBrCl$_2$, HC(NH$_2$)$_2$PbIBr$_2$, HC(NH$_2$)$_2$PbClBr$_2$, HC(NH$_2$)$_2$PbI$_2$Cl, HC(NH$_2$)$_2$PbICl$_2$, HC(NH$_2$)$_2$SnI$_3$, $HC(NH_2)_2SnBr_3$, $HC(NH_2)_2SnCl_3$, $HC(NH_2)_2SnF_3$, $HC(NH_2)_2SnBrI_2$, $HC(NH_2)_2SnBrCl_2$, $HC(NH_2)_2SnIBr_2$, $HC(NH_2)_2SnClBr_2$, $HC(NH_2)_2SnI_2Cl$, and $HC(NH_2)_2SnICl_2$.

3. The method according to claim 2, wherein the organic cation of the perovskite has a general formula of $(R_1R_2R_3R_4N_a)^+$, where $R_1$ is hydrogen, unsubstituted or substituted $C_1$-$C_{10}$ alkyl;

where $R_2$ is hydrogen, unsubstituted or substituted $C_1$-$C_{10}$ alkyl;

where $R_3$ is hydrogen, unsubstituted or substituted $C_1$-$C_{10}$ alkyl;

where $R_4$ is hydrogen, unsubstituted or substituted $C_1$-$C_{10}$ alkyl; and where a is a value between 1 and 10 with 1 and 10 included.

4. The method according to claim 1, wherein the substrate for depositing perovskite thin film is rigid.

5. The method according to claim 4, wherein the rigid substrate is glass, silicon, ITO coated glass, fluorine-doped tin oxide FTO coated glass, or any of them coated with semiconductor.

6. The method according to claim 1, wherein the substrate for depositing perovskite thin film is flexible.

7. The method according to claim 6, wherein the flexible substrate is ITO coated polyethylene terephthalate PET, ITO coated polyethylene-naphthalate PEN, ITO coated polyimide PI, FTO coated PET, FTO coated PEN, and FTO coated PI, or any of them coated with semiconductor.

8. The method according to claim 1, wherein the perovskite thin film is formed by one of spin coating, thermal evaporation, and doctor blading.

9. The method according to claim 1, wherein the mold is made from one of PDMS, PMMA, Silicon, Nickel, or Silicon dioxide; wherein the mold is dimensional periodic nanostructure with period;

wherein the mold is a two-dimensional hole or pillar structure with configuration;

wherein the liquid intermediate is formed at room temperature or elevated temperature;

wherein the chemical is nitrogen-containing compound, such as amines, including monoamines, diamines, triamines and polyamines, preferably including aliphatic monoamines such as methylamine, ethylamine, propylamine, butylamine, pentylamine, hexylamine, heptylamine, octylamine, 2-ethylhexylamine, nonylamine, decylamine, undecylamine, dodecylamine, tridecylamine, tetradecylamine, pentadecylamine, hexadecylamine, octadecylamine, octadecyleneamine, eicosylamine or docosylamine, alicyclic monoamines such as cyclohexylamine or methylcyclohexylamine, aromatic monoamines such as benzylamino or β-phenylmethylamine, symmetrical secondary amines such as N,N-dimethylamine, N,N-diethylamine, N,N-dipropylamine, N,N-dibutylamine, N,N-dihexylamine or N,N-dioctylamine, and mixed secondary amines such as N-methyl-N-ethylamine, N-methyl-N-butylamine, N-methyl-N-dodecylamine, N-methyl-N-octadecylamine, N-ethyl-N-hexadecylamine, N-ethyl-N-b octadecylamine, N-propyl-N-hexadecylamine or N-propyl-N-benzylamine.

10. The method according to claim 1, wherein the chemical is selected from the group consisting of ammonia, methylamine, formamidine, ethylamine, n-butylamine, tert-butylamine, and octylamine.

11. The method according to claim 1, wherein removing the introduced chemical is achieved by heating at a temperature between 25° C. and 150° C., evacuating under a pressure between $10^{-5}$ Pa and $10^5$ Pa, with both heating and evacuating, and/or natural volatilization at room temperature.

12. A perovskite periodic nanostructure, wherein the perovskite periodic nanostructure is fabricated using the method according to claim 1.

13. An optoelectronic device, wherein the device comprises a perovskite periodic nanostructure according to claim 12.

14. An optoelectronic device according to claim 13, wherein the device is any one selected from the group consisting of light emitting diodes, lasers, solar cells, and photodetectors.

15. A method of fabricating a perovskite tin doped indium oxide (ITO)/Poly(3,4-ethylenedioxythiophene) polystyrene sulfonate (PEDOT:PSS)/single-crystal methylammonium lead triiodide ($MAPbI_3$)/fullerene derivative [6,6]-phenyl-C61-butyric acid methyl ester ($PC_{61}BM$)/Ag LED structure comprising the steps of:

spin coating a ITO glass with PEDOT:PSS at rate of about 2,500-4,000 rpm;

annealing the coated glass at about 100° C.-130° C. for about 5-10 min;

fabricating a $MAPbI_3$ periodic nanostructure with a period of 735 nm on the PEDOT:PSS via an SLSPT approach;

spin coating $PC_{61}BM$ in 1, 2-Dichlorobenzene (DCB) on the $MAPbI_3$ periodic nanostructure and thin film, wherein the spin coating rate can be as low as 500 rpm;

thermally evaporating 100 nm Ag; and dissolving the $PC_{61}BM$ in DCB with a concentration of 30 mg/ml.

* * * * *